United States Patent [19]
Petropoulos et al.

[11] Patent Number: 5,581,185
[45] Date of Patent: Dec. 3, 1996

[54] TORQUE-BALANCED GRADIENT COILS FOR MAGNETIC RESONANCE IMAGING

[75] Inventors: Labros Petropoulos, Cleveland Heights; John L. Patrick, Chagrin Falls; Michael A. Morich, Mentor, all of Ohio

[73] Assignee: Picker International, Inc., Highland Heights, Ohio

[21] Appl. No.: 269,393

[22] Filed: Jun. 30, 1994

Related U.S. Application Data

[63] Continuation-in-part of Ser. No. 213,099, Mar. 15, 1994.
[51] Int. Cl.⁶ .............................. G01V 3/00; G01V 3/14; A61B 5/055
[52] U.S. Cl. ...................... 324/318; 324/322; 128/653.2; 128/653.5
[58] Field of Search ................... 324/318, 322; 128/653.2–653.5

[56] References Cited

U.S. PATENT DOCUMENTS

| | | | |
|---|---|---|---|
| 4,617,516 | 10/1986 | Schenck | 324/318 |
| 4,646,024 | 2/1987 | Schenck et al. | 324/318 |
| 4,737,716 | 4/1988 | Roemer | 324/319 |
| 4,758,813 | 7/1988 | Holsinger et al. | 335/306 |
| 5,036,282 | 7/1991 | Morich et al. | 324/318 |
| 5,177,442 | 1/1993 | Roemer | 324/318 |
| 5,185,576 | 2/1993 | Varek et al. | 324/318 |
| 5,198,769 | 3/1993 | Frese et al. | 324/318 |
| 5,235,283 | 8/1993 | Lehne et al. | 324/318 |
| 5,270,656 | 12/1993 | Roberts et al. | 324/318 |
| 5,278,504 | 1/1994 | Patrick et al. | 324/318 |

FOREIGN PATENT DOCUMENTS

| | | |
|---|---|---|
| 522742A1 | 6/1992 | European Pat. Off. |
| 4141514A1 | 8/1992 | Germany. |
| 2262808A | 6/1993 | United Kingdom. |
| WO94/28430 | 12/1994 | WIPO. |

OTHER PUBLICATIONS

"Torque Free Asymmetric Gradient Coils for Echo Planar Imaging", Abduljalil, et al., Mag. Res. in Med., 31 (1994) Apr. No. 4, pp. 450–453.

"Torque Compensated Asymmetric Gradient Coils for EPI", Abduljalil, et al., SMRM 12th Annual Meeting, vol. 3, p. 1306.

"A Torque–Balanced, Asymmetric Gradient Coil for Imaging of the Brain", Alsop, SMRM 12th Annual Meeting, p. 1359.

"NMR Imaging in Biomedicine, Supplement 2," Mansfield, et al., pp. 268–269 (1982).

"High Speed, High Field, Planar Surface Gradient Assembly for Fast Imaging", Roemer, et al., p. 134.

"Insertable Biplanar Gradient Coils for Magnetic Resonance Imaging", Martens, et al., Rev. Sci. Instrum. 62 (11) Nov. 1991, pp. 2639–2644.

*Primary Examiner*—Sandra L. O'Shea
*Assistant Examiner*—Mack Haynes
*Attorney, Agent, or Firm*—Fay, Sharpe, Beall, Fagan, Minnich & McKee

[57] ABSTRACT

A magnetic resonance imaging apparatus includes main field coils (10) for generating a temporally uniform magnetic field longitudinally through a central bore (12). A whole body gradient magnetic field coil (30) and radio frequency coil (36) are disposed around the bore. An insertable coil assembly (40) includes an insertable gradient coil (42) and a radio frequency coil (44). The insertable coil assembly place the gradient and radio frequency coil significantly closer to the region of interest to be imaged than the whole body coils. In the embodiment of FIG. 2, the gradient coil assembly is a cylindrical coil assembly including x, y, and z-gradient coils which receive current pulses in order to generate linear, uniform, magnetic field gradients through a selected region adjacent a patient end of the gradient coil. Although the asymmetric coil design promotes linearity of the magnetic field gradients and improves patient access, the currents in the asymmetric coil interact with the main magnetic field to generate a net torque. Additional windings (72) are added on the service end, opposite to the patient end, of the gradient coil to (1) contribute to the linearity and uniformity of the gradient magnetic field and (2) to generate counteracting torques.

10 Claims, 4 Drawing Sheets

TORQUE-BALANCED GRADIENT COILS FOR MAGNETIC RESONANCE IMAGING

This application is a continuation-in-part of U.S. application Ser. No. 08/213,099 filed Mar. 15, 1994.

BACKGROUND OF THE INVENTION

The present invention relates to the magnetic resonance imaging art. It finds particular application in conjunction with insertable gradient coils for high speed imaging techniques and will be described with particular reference thereto.

Magnetic resonance imagers commonly include a large diameter, whole body gradient coil which surrounds a patient receiving bore. Main field magnets, either superconducting or resistive, and radio frequency transmission/reception coils also surround the bore. Although the whole body gradient coils produce excellent linear magnetic field gradients, they have several drawbacks. With large diameter gradient coils, the slew rate is sufficiently slow that it is a limiting factor on the rate at which gradient magnetic fields can be induced and changed. Large diameter whole body gradient coils have relatively low gradient field per unit drive ampere for a given inductance, which limits their use for some of the highest speed magnetic resonance imaging techniques. The energy stored in gradient coils is generally proportional to greater than the fifth power of the radius. Hence, large diameter, whole body coils require large amounts of energy. Further, superconducting main magnets have cold shields disposed around the bore. The larger the diameter of the gradient coil, the closer it is to the cold shields and hence the more apt it is to produce eddy currents. More shielding is needed to prevent the whole body gradient coils from inducing eddy currents in the cold shields than would be necessary for smaller diameter coils.

Due to these and other limitations in whole body coils, numerous insertable coils have been developed which are small enough to fit within the bore with the patient. Typically, the insertable coils are customized to a specific region of the body, such as a head coil, or a cardiac coil. Traditionally, head coils have been a cylinder sized to accommodate the human head easily, e.g. 28 cm in diameter, while cardiac coils have been biplanar sized to accommodate the human torso. Most brain examinations center around the portion of the brain that is substantially in the same plane as the eye sockets. In a symmetric coil, the magnetic and physical isocenters are both configured to be disposed in a common plane with the patient's eyes, or patient's heart.

As a general rule, the longer the cylindrical head coil, the larger the region over which the gradient is linear and the more linear the region is. However, the patient's shoulders are a limiting factor on the length of a symmetric gradient coil. The shoulders limit the isocenter to about 20 cm at the patient end. Thus, symmetric head coils have heretofore been limited to about 40 cm in length.

In order to achieve the beneficial effects of a longer head coil, head coils have been designed in which the magnetic isocenter is offset toward the patient from the physical geometric center of the coil. See, for example, U.S. Pat. Nos. 5,278,504 of Patrick, et al. or 5,177,442 of Roemer, et al. Although asymmetric head coils have beneficial effects on the linearity and the size of the linear region, the improvement is not without an offsetting difficulty. Within the main magnetic field, the asymmetric gradient coil is subject to mechanical torques from the main and gradient magnetic field interactions. In order to counteract these torques, the asymmetric head coils are mounted with rigid mechanical constraints. Even with substantial mechanical structures anchored to the main field magnet assembly, the torque still tends to cause at least mechanical vibration and noise.

Not all insertable gradient coils are cylindrical. Some, for example, as mentioned previously, are planar or biplanar. See, for example, U.S. Pat. No. 5,036,282 of Morich, et al. Planar and biplanar gradient coils also suffer from mechanical torques. Again, rigid mechanical constraints were used, but were generally insufficient to remove all mechanical vibration and noise.

The present invention provides a new and improved gradient coil for asymmetric cylindrical and symmetrical biplanar designs which overcomes the above-referenced problems and others.

SUMMARY OF THE INVENTION

A gradient coil which has an asymmetric sweet spot or which is not circularly symmetric is provided. Gradient magnetic field inducing windings, which are disposed adjacent the sweet spot, subject the coil to a torque when pulsed with current for inducing a magnetic field gradient. Additional windings are provided adjacent at least one end of the coil for generating a magnetic field which counteracts the torques.

In accordance with another aspect of the present invention, a biplanar z-gradient coil is provided. Windings are provided at the ends of each of the planar gradient coils which zero the net torque on each of the planar gradient coils.

In accordance with another aspect of the present invention, a cylindrical x, y, or z-gradient coil is provided with winding patterns which place the sweet spot offcenter toward a patient end of the coil. Additional windings are provided at a service end of the coil such that current pulses for producing gradient magnetic fields cause torque balancing gradient magnetic field pulses which eliminate the torque on the coil while maintaining the linearity of the magnetic field gradient through the sweet spot.

In accordance with another aspect of the present invention, continuous and discrete current patterns are provided for torques on transverse x and y, asymmetric gradient coils.

One advantage of the present invention is that it eliminates the torques on asymmetric, planar, and other gradient coils which inherently suffer a net torque when actuated within the main field of a magnetic resonance device.

Another advantage of the present invention is that it minimizes stored energy within the coil, while maintaining a desired gradient strength and uniformity.

Another advantage of the present invention is that it reduces the rise time for gradient magnetic field coils.

Another advantage of the present invention is that sturdy, torque resisting mechanical support structures are unnecessary or made of secondary concern.

Another advantage of the present invention is that MRI images with minimal distortion and ghosting are achieved.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps

DETAILED DESCRIPTION OF THE PREFERRED EMBODIMENTS

Figure 1:
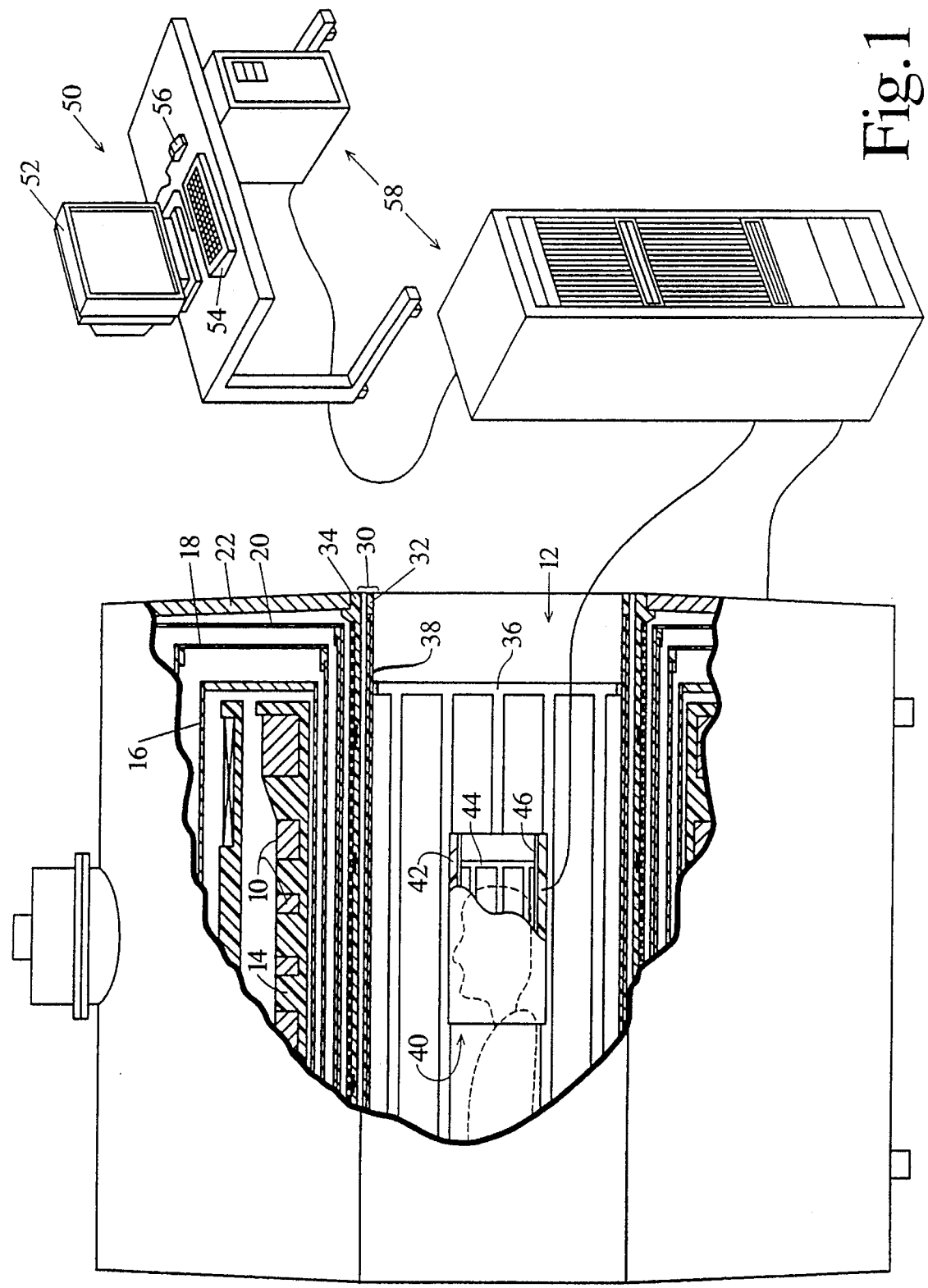
FIG. 1 is a diagrammatic illustration of a magnetic resonance imaging system including an insertable gradient coil in accordance with the present invention.

With reference to FIG. 1, a plurality of primary magnet coils 10 generate a temporally constant magnetic field along a longitudinal or z-axis of a central bore 12. In a preferred superconducting embodiment, the primary magnet coils are supported by a former 14 and received in a toroidal helium vessel or can 16. The vessel is filled with liquid helium to maintain the primary magnet coils at superconducting temperatures. The can is surrounded by a series of cold shields 18, 20 which are supported in a vacuum dewar 22.

A whole body gradient coil assembly 30 includes x, y, and z-coils mounted along the bore 12. Preferably, the gradient coil assembly is a self-shielded gradient coil assembly that includes primary x, y, and z-coil assemblies 32 potted in a dielectric former and a secondary gradient coil assembly 34 that is supported on a bore defining cylinder of the vacuum dewar 22. A whole body RF coil 36 is mounted inside the gradient coil assembly 30. A whole body RF shield 38, e.g. copper mesh, is mounted between RF coil 36 and the gradient coil assembly 34.

An insertable gradient coil 40 is removably mounted in the center of the bore 12. The insertable coil assembly includes an insertable gradient coil assembly 42 supported by a dielectric former. An insertable RF coil 44 is mounted inside the dielectric former. An RF shield 46 is mounted between the insertable RF and gradient coils.

An operator interface and control station 50 includes a human-readable display such as a video monitor 52 and an operator input means including a keyboard 54 and a mouse 56. A computer control and reconstruction module 58 includes computer hardware and software for controlling the radio frequency coils 36 and 44 and the gradient coils 30 and 42 to implement any of a multiplicity of conventional magnetic resonance imaging sequences, including echo-planar and echo-volume imaging sequences. Echo-planar imaging and echo-volume imaging sequences are characterized by short repetition rates and low flip angles. The processor 58 also includes a digital transmitter for providing RF excitation and resonance manipulation signals to the RF coils and a digital receiver for receiving and demodulating magnetic resonance signals. An array processor and associated software reconstruct the received magnetic resonance signals into an image representation which is stored in computer memory or on disk. A video processor selectively extracts portions of the stored reconstructed image representation and formats the data for display by the video monitor 52.

Figure 2:
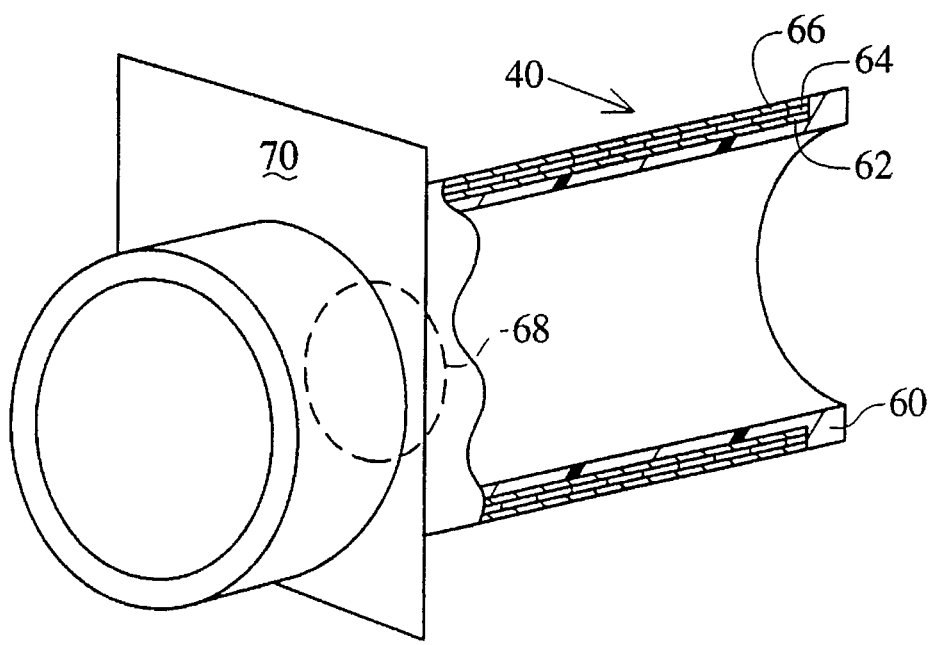
FIG. 2 is an enlarged diagrammatic illustration of an asymmetric cylindrical gradient coil in accordance with the present invention.

In the embodiment of FIG. 2, the active gradient coil windings of the insertable gradient coil assembly 40 are supported on a cylindrical, dielectric former 60. Preferably, the former is surrounded by an x-gradient coil 62, a y-gradient coil 64, and radially outermost, a z-gradient coil 66. The x, y, and z-gradient coils may be encased in an epoxy resin to become a unitary portion of the former or may be built on two or more discrete formers to provide cooling passages between the gradient coils. Preferably, the x, y, and z-gradient coils are distributed coils, although bunched windings are also contemplated.

The distributed or fingerprint coils have an asymmetric winding pattern such that the sweet spot, i.e. the region of the coil with optimal linearity and uniformity, is disposed offset from the geometric center towards a patient end of the coil.

Figure 3:
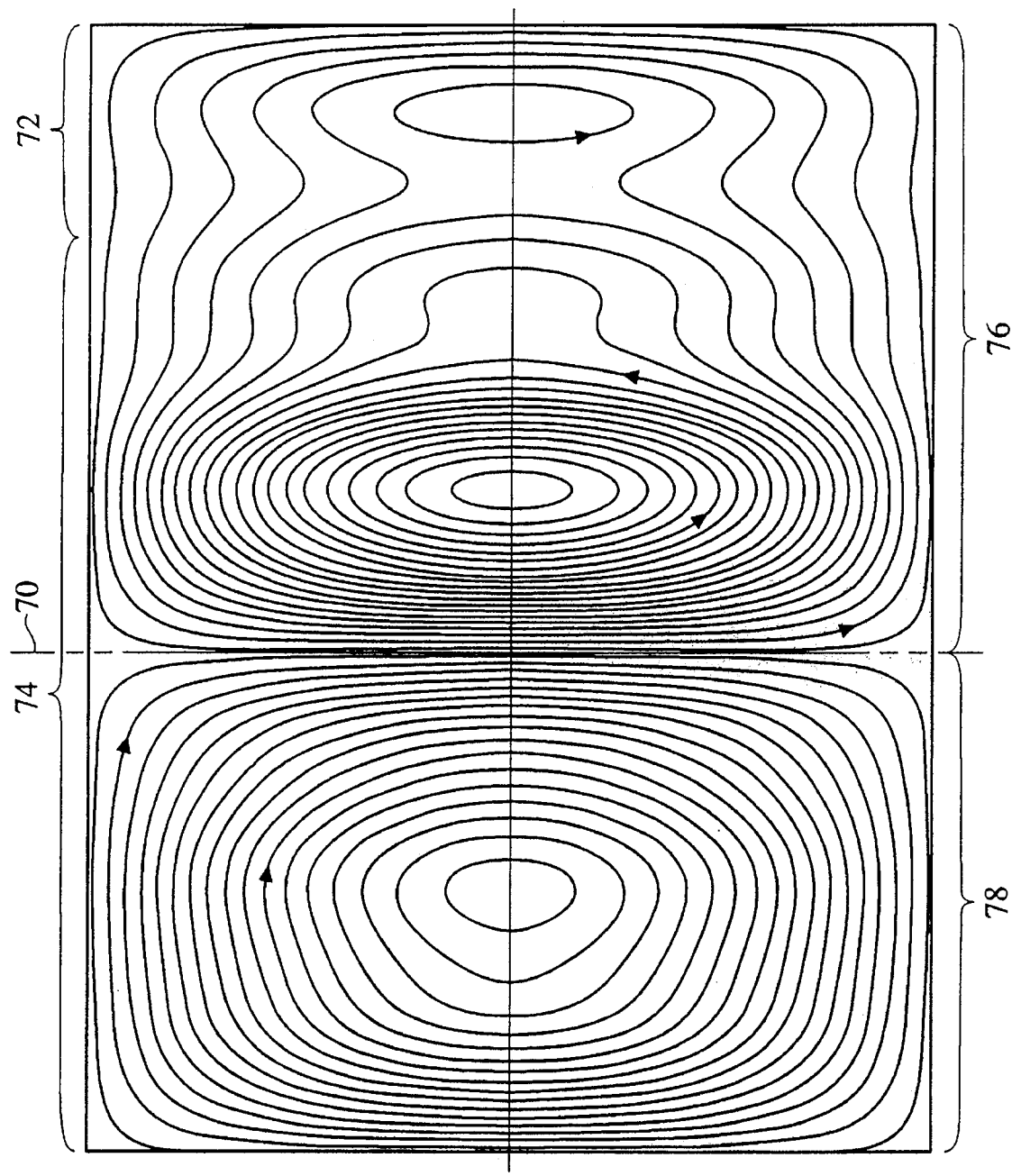
FIG. 3 is a diagrammatic illustration of the windings of an x-gradient coil in accordance with the present invention.

The distributed winding pattern of FIG. 3 is one half an x or y-gradient coil. The half is curved around one side of the dielectric cylinder and a mirror image half is mounted around the cylinder 180° opposite. A similar pair of gradient coil halves are mounted rotated 90° about the z-axis to function as the other of the x and y-gradient coils. The winding pattern is configured to optimize x or y-gradient linearity in a generally spherical region 68 within the coil centered on a plane 70. A further torque correcting winding pattern portion 72 is provided such that the generated magnetic field creates a zero net magnetic torque. That is, a primary winding pattern 74 and the torque neutralizing pattern 72 interact to (1) create a uniform gradient centered on the plane 70 and (2) create a zero net torque. Stated another way, the primary and torque balancing coil portions create equal and opposite torques relative to a geometric center point of the coil. Various techniques are contemplated for adjusting the relative torques. For example, the length of the gradient coil along the z-axis can be increased or decreased to modify the "lever arm" with which the torque correction coil acts. However, preferably the length of the z-gradient coil is fixed and the winding pattern of the primary and torque correction windings are designed with the length of the coil in the z-axis taken as a constraint.

Asymmetrical cylindrical gradient coils have less stored energy and faster gradient rise times than their symmetrical cylindrical counterparts due in part to the lack of severe length constraints on the gradient coil structure associated with asymmetrical cylindrical gradient coils. The present technique eliminates the torque effects in an asymmetric cylindrical coil design. Due to the symmetry in the radial direction, it is the transverse gradient coil structures which experience torque effects. In particular, when symmetry in the longitudinal variable z is lost, a net torque results. Accordingly, the expressions of both components of the surface current density for the gradient coil are chosen such that they generate a transverse gradient field with the desired linearity and uniformity, yet eliminating the net torque which is generated by the interaction of the current density with the z-component of the main magnetic field of the magnetic resonance imager. For a finite size cylindrical coil, the expression for the two components of the current density are:

$$J_\phi^a(\phi,z) = \cos(\phi) \sum_{n=1}^{\infty} [j_{\phi1n}^a \cos k_{1n}z + j_{\phi2n}^a \{k_{1n}\sin 2k_{1n}z + k_{2n}\sin 2k_{2n}z\}], \quad (1a)$$

$$|z| \leq \frac{L}{2}$$

-continued $$J_z^a(\phi,z) = \sin(\phi) \sum_{n=1}^{\infty} \left[ \frac{j_{\phi1n}^a}{k_{1n}a} \sin k_{1n}z + \frac{j_{\phi2n}^a}{a} \{\sin^2 k_{1n}z - \sin^2 k_{2n}z\} \right]. \quad (1b)$$

$$|z| \leq \frac{L}{2}$$

Both quantities are zero for $|z|>L/2$ with $k_{1n}=2m\pi/L$, $k_{2n}=2(m-1)\pi/L$, where L represents the total length of the cylinder. Expressing the magnetic field and the stored energy in terms of the current density $j^a$ and the Green function for cylindrical coordinates, the corresponding functional E has the form:

$$E(j_{1n}^a, j_{2n}^a) = W - \sum_{j=1}^{N} \lambda_j (B_z(\vec{r}_j) - B_z sc(\vec{r}_j)), \quad (2)$$

where W is the stored energy, $\lambda_j$ are the Lagrange multipliers, $B_z(\vec{r}_j)$ is the calculated value of the magnetic field at the constraint points $\vec{r}_j$, $B_z sc(\vec{r}_j)$ are the constraint values of the magnetic field at the constraint points. Minimizing E with respect to the current density, a matrix equation for $j^a_{\phi1n'}$ and $j^a_{\phi2n'}$ are obtained as follows:

$$\sum_{n'=1}^{\infty} j_{\phi1n'}^a \left\{ -\frac{aL\pi}{2} \int_{-\infty}^{\infty} dk I'_1(ka) K'_1(ka) \psi_{1n}(k) \psi_{1n'}(k) \right\} = \quad (3a)$$

$$-\sum_{j=1}^{N} \lambda_j \cos\phi_j \int_{-\infty}^{\infty} dk k \cos k z_j I_1(k\rho_j) K'_1(ka) \psi_{1n}(k),$$

$$\sum_{n'=1}^{\infty} j_{\phi2n'}^a \left\{ -\frac{aL\pi}{2} \int_{-\infty}^{\infty} dk I'_1(ka) K'_1(ka) \psi_{2n}(k) \psi_{2n'}(k) \right\} = \quad (3b)$$

$$-\sum_{j=1}^{N} \lambda_j \cos\phi_j \int_{-\infty}^{\infty} dk k \sin k z_j I_1(k\rho_j) K'_1(ka) \psi_{2n}(k),$$

where:

$$\psi_{1n}(k) = \left[ \frac{\sin(k-k_{1n})\frac{L}{2}}{(k-k_{1n})\frac{L}{2}} + \frac{\sin(k+k_{1n})\frac{L}{2}}{(k+k_{1n})\frac{L}{2}} \right]$$

$$\psi_{2n}(k) = k_{2n} \left[ \frac{-\sin(k-2k_{2n})\frac{L}{2}}{(k-2k_{2n})\frac{L}{2}} + \frac{\sin(k+2k_{2n})\frac{L}{2}}{(k+2k_{2n})\frac{L}{2}} \right] +$$

$$k_{1n} \left[ \frac{-\sin(k-2k_{1n})\frac{L}{2}}{(k-2k_{1n})\frac{L}{2}} + \frac{\sin(k+2k_{1n})\frac{L}{2}}{(k+2k_{1n})\frac{L}{2}} \right]$$

Determining the Lagrange multipliers $\lambda_j$ using the constraint equation for the magnetic field, the continuous current density distribution for the azimuthal $J^a_\phi$ and the axial $J^a_z$ components of the current density are obtained. By applying stream function techniques to the continuous current density, the positive and negative current patterns for the current density are generated for the creation of high quality transverse gradient fields. The magnetic field is reevaluated inside and outside the imaging volume by applying the Biot-Savart formula to the discrete current distribution. In FIG. 3, the asymmetric cylindrical gradient coil has a positive current distribution 76 in which each of the 20 turns carries a current of 325 amps and a discrete negative current distribution 78 in which each of 17 turns carries 325 amps of current. Using constraints of an x-gradient coil which is 0.85 m long and 0.36 m in diameter and four constraint point to generate a 40 mT/m gradient field strength with 5% on-axis linearity and 10% off-axis uniformity at the borders of a 29 cm diameter spherical volume, one obtains the current distribution of FIG. 3.

Alternatively, the current patterns can be changed to produce either better linearity at the price of coil efficiency or greater coil efficiency at the price of linearity. Analogously, a greater offset of the center of the gradient imaging volume can be obtained at the price of linearity or efficiency or a combination of the two. Similar design constraints can be applied to actively shielded gradient coils such that eddy current effects are further eliminated. The active shield coils are designed using the above-described techniques.

Figure 4:
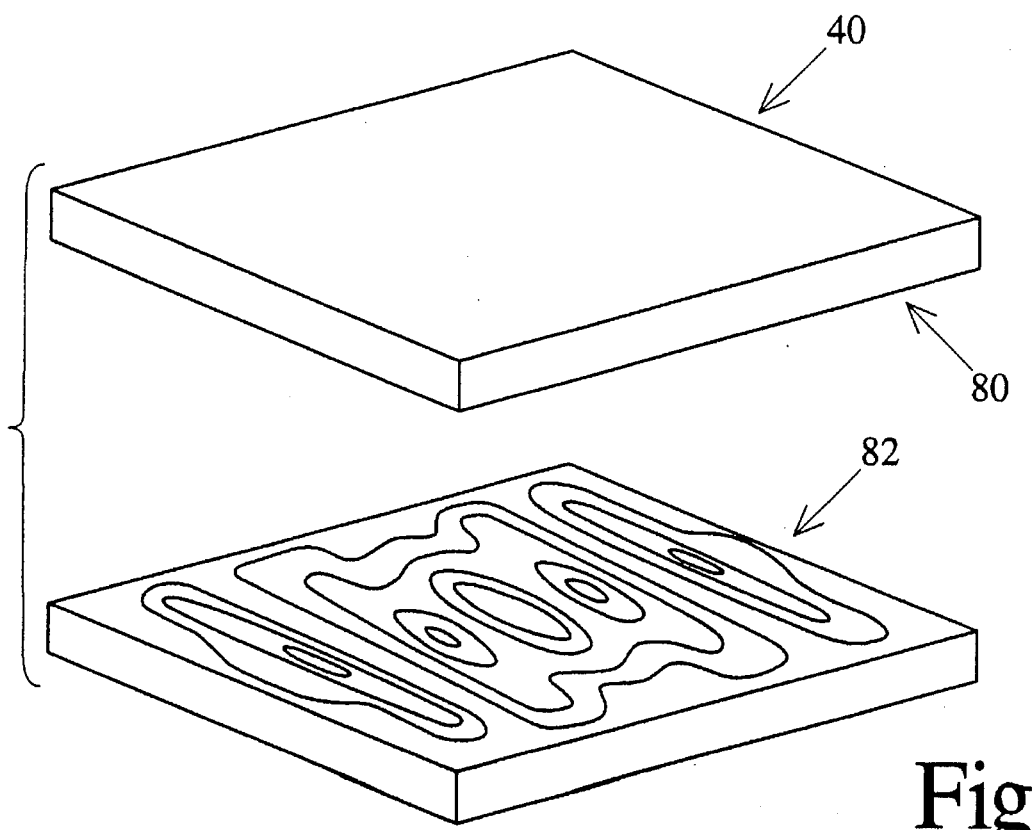
FIG. 4 is an enlarged illustration of a biplanar gradient coil in accordance with the present invention; and, FIG. 5 is a detailed illustration of the winding pattern of the biplanar gradient coil of FIG. 4.

With reference to FIG. 4, planar gradient coils, preferably biplanar gradient coils, are also contemplated. In the biplanar gradient coil, a first planar gradient coil 80 is disposed below the subject and a second planar gradient coil 82 is disposed above the subject. Although the torque on the upper and lower planar gradient coils taken together may cancel, the net torques tend to disrupt the parallel relationship of the coils, cause vibration, noise, and the like. Further, to realize a net torque of zero without zeroing the individual torques, the top and bottom halves must be structurally linked, which would inhibit access. Accordingly, it is advantageous to zero the torque in each of the planar coils individually.

In cylindrical coils, stored magnetic energy follows a $r^5$ power law, where r is the radius of the coil. Accordingly, biplanar coils have a significant advantage over cylindrically shaped whole body gradient coils because they may occupy less volume while maintaining the same diameter spherical volume. Further, biplanar gradient coils have improved patient access, i.e. for cardiac and other torso imaging applications.

The present technique eliminates the net torque on each of the planar surfaces which is originated from the interaction between its current pattern orientation and the direction of the main magnetic field. The expressions for both components of the surface current density $J^a_x$ and $J^a_z$ are chosen such that they generate a gradient field along the z-direction with the desired linearity and uniformity, but which eliminate the net torque in each plane which is generated with the interaction of the current density with the z-component of the main magnetic field. Because the planar coils have finite size, the expressions for the two components of current density are:

$$J_x^a(x,z) = \sum_{n=1}^{\infty} \sum_{m=1}^{\infty} \left[ \frac{\epsilon_{nm}}{k_{1n}} j_{nm}^a \cos k_{1n}x \{l_{1m}\sin 2l_{1m}z + l_{2m}\sin 2l_{2m}z\} \right], \quad (4a)$$

$$J_z^a(x,z) = \sum_{n=1}^{\infty} \sum_{m=1}^{\infty} [\epsilon_{nm} j_{nm}^a \sin k_{1n}x \{\sin^2 l_{1m}z - \sin^2 l_{2m}z\}], \quad (4b)$$

where $k_{1n}=(2n-1)\pi/2b$, $l_{1m}=m\pi/c$, and $l_{2m}=(2m-1)\pi/2c$, where 2a, 2b, and 2c represent the gap between the two planes, the total width of each plane and the total length of each plane, respectively.

Expressing the magnetic field and the stored magnetic energy W in terms of the current density $J^a_{nm}$ and the Green function for cartesian coordinates, the corresponding functional E has the form:

$$E(j_{nm}^a) = W - \sum_{j=1}^{N} \lambda_j (B_z(\vec{r}_j) - B_2 sc(\vec{r}_j)), \quad (5)$$

where W is the stored energy, $\lambda_j$ are the Lagrange multipliers, $B_z(\vec{r}_j)$ is the calculated value of the magnetic field at the constraint points $\vec{r}_j$ and $B_z sc(\vec{r}_j)$ are the constraint values of the magnetic field at the constraint points. Minimizing E with respect to the current density, a matrix equation for $j^a_{n'm'}$ is obtained as follows:

$$\sum_{n'=1}^{\infty} \sum_{m'=1}^{\infty} j^a_{n'm'} \frac{\mu_o}{\pi^2} \int_{-\infty}^{\infty} \int_{-\infty}^{\infty} d\alpha d\beta \frac{\cos^2(\alpha b)\sin^2(\beta c)(1-e^{-2a\sqrt{\alpha^2+\beta^2}})\beta^2 \sqrt{\alpha^2+\beta^2} (-1)^{m+m'}}{(\alpha^2-k_{1n}^2)(\alpha^2-k_{1n'}^2)} \quad (6)$$

$$\left\{ -\frac{1}{(\beta^2-4l_{1m}^2)} + \frac{1}{(\beta^2-4l_{2m}^2)} \right\} \left\{ -\frac{1}{(\beta^2-4l_{1m'}^2)} + \frac{1}{(\beta^2-4l_{2m'}^2)} \right\}$$

$$= \sum_{j=1}^{N} \lambda_j \frac{\mu_o}{2\pi^2} \int_{-\infty}^{\infty} \int_{-\infty}^{\infty} d\alpha d\beta \frac{\cos(\alpha x_j)\sin(\beta z_j)\cos(\alpha b)\sin(\beta c)(-1)^m}{(\alpha^2-k_{1n}^2)}$$

$$\beta^2 e^{-a\sqrt{\alpha^2+\beta^2}} \cosh y_k \sqrt{\alpha^2+\beta^2} \left\{ -\frac{1}{(\beta^2-4l_{1m}^2)} + \frac{1}{(\beta^2-4l_{2m}^2)} \right\}.$$

Determining the Lagrangian multipliers $\lambda_j$ using the constraint equation for the magnetic field, continuous current density distributions for $J^a_x$ and $J^a_z$ components of the current density are obtained. Applying the stream function technique to the continuous current density, the positive and negative current patterns for the current density which create a high quality gradient along the z-direction are generated. The magnetic field is reevaluated inside and outside the imaging volume by applying the Biot-Savart formula to the discrete current distribution.

In one preferred embodiment, a biplanar gradient coil includes two planes whose interplanar spacing a=0.4472 m, the half width of each plane b=0.25 m, and its half length c=0.6 m, respectively. Employing three constraint points in order to generate a 40 mT/m gradient field strength with 10% on-axis linearity and 10% off-axis uniformity at borders of a 25 cm diameter spherical volume and then using the stream function technique, generates the positive and negative current patterns of FIG. 5.

Of course, the current patterns can be adjusted to improve linearity at the price of coil efficiency or greater efficiency at the price of linearity. Biplanar gradient coils of other dimensions for larger or smaller regions of the subject, e.g. for real time knee imaging applications and cardiac imaging, are also contemplated. Preferably, the gradient coils include an active shield gradient coil 84, 86 designed using the above-discussed techniques. The shield gradient coils interact with the primary gradient coils to produce the linear and uniform spherical imaging volume between the biplanar gradient coils and counteract each other outside the biplanar gradient coils to eliminate external magnetic fields.

Figure 5:
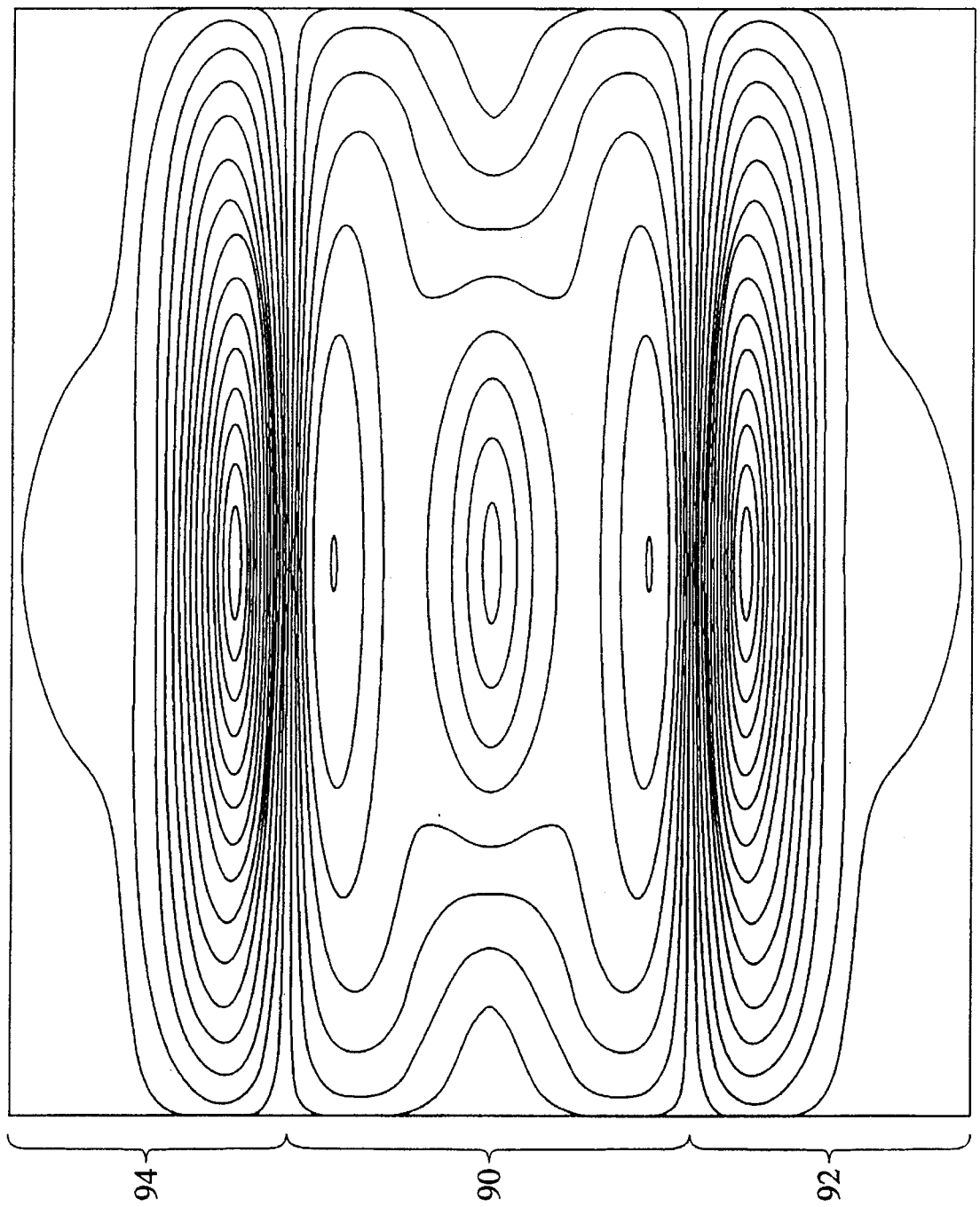

In the planar gradient coil of FIG. 5, there are 16 positive and 8 negative current turns. The turns define a central gradient portion 90 and a pair of end torque balancing portions 92, 94.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus as comprising:

a main magnetic assembly for generating a temporally constant magnetic field through a central bore thereof;

a radio frequency coil for at least transmitting radio frequency signals into the central bore for inducing and manipulating magnetic resonance of selected dipoles in the bore;

a radio frequency receiver for receiving magnetic resonance signals emanating from the selected dipoles in the bore and reconstructing an image representation from the magnetic resonance signals; and, a magnetic field gradient coil assembly including a pair of planar gradient coils disposed on opposite side of a central, longitudinal axis of the bore for generating the linear, uniform, magnetic field gradients therebetween, each of the planar gradient coils having (i) a first distributed coil winding portion which receives a current pulse to induce a first magnetic field gradient pulse across the selected portion across the longitudinal axis but which current pulse causes a first torque on the planar gradient coil and (ii) a second distributed coil winding portion which receives a current pulse to generate a second magnetic field gradient pulse, the first and second magnetic field gradient pulses summing to form a linear and uniform combined magnetic field gradient pulse and which current pulse interacts with the main magnetic field to generate a second torque which cancels the first torque to zero a net torque on each planar gradient coil.

2. The magnetic resonance imaging apparatus as set forth in claim 1 wherein the second distributed coil winding portion includes windings on opposite ends of each of the planar gradient coils.

3. A planar magnetic field gradient coil assembly for disposition within the bore of a magnetic resonance apparatus for generating magnetic field gradients across a selected portion of the subject within a main magnetic field in the bore, the gradient coil assembly comprising:

a first planar coil winding portion, which receives first current pulses to induce first magnetic field gradient pulses across the selected portion of the subject but which first current pulses interact with the main magnetic field to cause a first torque on the gradient coil assembly; and a second planar gradient coil winding portion which receives second current pulses to generate second magnetic field gradient pulses across the selected subject portion, the first and second current pulses being received concurrently, the first and second magnetic field gradient pulses combining to form linear and uniform combined magnetic field gradient pulses across the selected subject portion, the second current pulses interacting with the main magnetic field to generate a second torque, the first and second torques cancelling each other.

4. The gradient coil assembly as set forth in claim 3 wherein the first coil winding portion includes a first winding disposed on a first planar surface and a second winding disposed on a second planar surface, the first and second planar surfaces being parallel to each other and disposed on opposite sides of the selected subject portion.

5. The gradient coil assembly as set forth in claim 4 wherein the second coil winding portion includes windings disposed on opposite ends of the first and second planar surfaces.

6. A magnetic field gradient coil assembly for disposition within the bore of a magnetic resonance apparatus for generating magnetic field gradients across a selected portion of the subject within a main magnetic field in the bore, the gradient coil assembly comprising:

a cylindrical dielectric former;

a first pair of distributed coil winding portions mounted opposite each other adjacent a first end of the dielectric former, the first pair of distributed coil winding portions receiving current pulses to induce first magnetic field gradient pulses transversely across the selected portion of the subject displaced from a geometric center of the cylindrical former toward the first end, which current pulses interact with the main magnetic field to cause a first torque on the cylindrical dielectric former; and a second pair of distributed coil winding portions mounted opposite each other on the cylindrical dielectric former adjacent the first pair of distributed coil winding portions, the second pair of distributed winding portions receiving current pulses to generate second magnetic field gradient pulses across the selected subject portion, the first and second magnetic field gradient pulses combining to generate a linear and uniform magnetic field gradient pulse displaced from the geometric center of the cylindrical former toward the first end, which current pulses interact with the main magnetic field to generate a second torque on the cylindrical dielectric former, the first and second torques cancelling each other.

7. The magnetic field gradient coil assembly as set forth in claim 6 wherein each of the first pair of distributed coil winding portions includes a series of concentric ovoid windings.

8. The magnetic field gradient coil assembly as set forth in claim 7 wherein each of the second pair of distributed coil winding portions includes a series of concentric asymmetric loop windings.

9. The magnetic field gradient coil assembly as set forth in claim 8 wherein the asymmetric loop windings are generally pear shaped.

10. The magnetic field gradient coil assembly as set forth in claim 7 wherein each of the second pair of distributed coil winding portions includes (i) a relatively dense series of graduated, concentric ovoid windings disposed adjacent the first generally ovoid windings, at least one oval loop adjacent the series of graduated, ovoid windings, and a plurality of windings surrounding the series of graduated, ovoid windings and the at least one ovoid loop.

* * * * *